United States Patent
Kwon et al.

(10) Patent No.: US 10,459,165 B2
(45) Date of Patent: Oct. 29, 2019

(54) OPTICAL MODULE

(71) Applicant: Electronics and Telecommunications Research Institute, Daejeon (KR)

(72) Inventors: Won Bae Kwon, Gwangju (KR); Jong Jin Lee, Gwangju (KR); Eun Kyu Kang, Gwangju (KR); Jeong Eun Kim, Gwangju (KR); Soo Yong Jung, Gwangju (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/866,697

(22) Filed: Jan. 10, 2018

(65) Prior Publication Data

US 2019/0025517 A1    Jan. 24, 2019

(30) Foreign Application Priority Data

Jul. 18, 2017    (KR) .................... 10-2017-0091024

(51) Int. Cl.
```
G02B 6/30     (2006.01)
G02B 6/26     (2006.01)
G02F 1/035    (2006.01)
G02B 6/42     (2006.01)
H05K 1/02     (2006.01)
```
(Continued)

(52) U.S. Cl.
CPC .............. *G02B 6/26* (2013.01); *G02B 6/3608* (2013.01); *G02B 6/4204* (2013.01); *G02B 6/4245* (2013.01); *G02B 6/4249* (2013.01); *G02B 6/4281* (2013.01); *G02F 1/0356* (2013.01); *H05K 1/025* (2013.01); *G02B 6/3636* (2013.01); *G02F 1/2255* (2013.01); *H01L 2924/30107* (2013.01); *H05K 2201/10121* (2013.01)

(58) Field of Classification Search
USPC .......................................... 385/2, 39, 49, 89
See application file for complete search history.

(56) References Cited

U.S. PATENT DOCUMENTS 9,759,878 B2 * 9/2017 Lee ..................... G02B 6/4274
2002/0085816 A1   7/2002 Nishimura
(Continued)

FOREIGN PATENT DOCUMENTS

EP         0893861 A2 *  1/1999  ........... G02B 6/4204
KR         1999-014073    2/1999
(Continued)

*Primary Examiner* — Eric Wong
(74) *Attorney, Agent, or Firm* — Kile Park Reed & Houtteman PLLC

(57) ABSTRACT

The present invention relates to an optical module, and more specifically, to an optical module which allows an optical coupling loss of an optical signal to be minimized and a frequency bandwidth thereof to be maximized. The optical module according to an embodiment of the present invention includes: a circuit substrate; an electronic element mounted on one surface of the circuit substrate; an optical element mounted on another surface perpendicular to the one surface of the circuit substrate; a capacitor mounted between the electronic element and the optical element; and an optical waveguide array on which an optical waveguide is disposed.

11 Claims, 3 Drawing Sheets

(51) Int. Cl.
*G02B 6/36* (2006.01)
*G02F 1/225* (2006.01)

(56) References Cited

U.S. PATENT DOCUMENTS

| | | | |
|---|---|---|---|
| 2004/0005119 A1* | 1/2004 | Han | G02B 6/42 |
| | | | 385/49 |
| 2014/0147128 A1 | 5/2014 | Han et al. | |
| 2014/0169389 A1 | 6/2014 | Kim et al. | |
| 2016/0209609 A1 | 7/2016 | Lee | |
| 2016/0336368 A1 | 11/2016 | Lee et al. | |
| 2016/0363834 A1* | 12/2016 | Velthaus | G02F 1/2255 |

FOREIGN PATENT DOCUMENTS

| | | |
|---|---|---|
| KR | 2003-0094712 | 12/2003 |
| KR | 10-2016-0088455 | 7/2016 |

* cited by examiner

OPTICAL MODULE

CROSS-REFERENCE TO RELATED APPLICATION

This application claims priority to and the benefit of Korean Patent Application No. 10-2017-0091024, filed on Jul. 18, 2017, the disclosure of which is incorporated herein by reference in its entirety.

BACKGROUND

1. Field of the Invention

The present invention relates to an optical module, and more specifically, to an optical module which allows an optical coupling loss of an optical signal to be minimized and a frequency bandwidth thereof to be maximized.

2. Discussion of Related Art

As data traffic increases in the field of optical communication, a method of transmitting a large amount of data at a high speed is required. As one example, a 100 Gbit or more optical transceiver module is formed as a multi-channel parallel connection type optical transceiver module in which optical transceiver modules have a transmission rate of 25 Gbit per unit channel, or uses a method of transmitting data through wavelength division multiplexing (WDM).

As related arts, "Parallel Optical Interconnection Module and Method for Manufacturing Thereof" (hereinafter, Related Art 1) is disclosed in Korean Patent No. 10-0461157, "Optical Receiver Module using Wavelength Division Multiplexing Type" (hereinafter, Related Art 2) is disclosed in US Patent Publication No. 2014/0169389, "Optical Module and Method of Assembling the Optical Module" (hereinafter, Related Art 3) is disclosed in U.S. Pat. No. 6,874,952, and "Optical Module" (hereinafter, Related Art 4) is disclosed in Korean Patent Laid-open No. 10-2016-0088455.

In Related Art 1, a parallel optical coupling module to which an optical waveguide having a reflective curved surface is applied is disclosed. In a structure disclosed in Related Art 1, since all light rays incident on the reflective curved surface through the optical waveguide are not totally reflected thereby but some of the light rays are emitted to an outside of the optical waveguide, there is a problem in that an optical coupling loss occurs. In addition, in a case in which a process error occurs when the structure according to Related Art 1 is formed, there is a problem in that an additional optical coupling loss occurs due to the process error.

In Related Art 2, an optical coupling method in which an optical device including a mirror having a 45° inclination angle and an array lens is used is disclosed. However, the invention disclosed in Related Art 2 has a problem in that a large optical coupling loss occurs even when a slight misalignment occurs between the optical device and a photodetector.

In Related Art 3, an optical module having a structure in which a spacer is attached to an optical fiber array and a substrate to optically couple the optical fiber array and the substrate, and transmission lines are disposed on two perpendicular surfaces is disclosed. The structure disclosed in Related Art 3 has a disadvantage in that a reflection loss is large at a high frequency because the transmission lines are perpendicular to each other, and thus a frequency bandwidth decreases. In addition, the structure disclosed in Related Art 3 has a disadvantage in that it is difficult to form patterns of the transmission lines and a high manufacturing cost is required to form the perpendicular transmission lines.

In Related Art 4, a structure in which an optical waveguide is optically aligned with an optical element, and a glass rod in which a transmission line is formed between the optical element and an electronic element is applied thereto is disclosed. However, the structure disclosed in Related Art 4 has a problem in that a high cost laser apparatus is required for forming the transmission line and an additional manufacturing time is required to form the curved glass rod, a pattern, and the like.

SUMMARY OF THE INVENTION

The present invention is directed to an optical module which allows an optical coupling loss to be minimized and optical coupling efficiency to be improved.

In addition, the present invention is directed to an optical module which allows a frequency bandwidth to be maximized by an impedance matching structure being formed when an optical element and an electronic element are electrically connected.

According to an aspect of the present invention, there is provided an optical module including: a circuit substrate; an electronic element mounted on one surface of the circuit substrate; an optical element mounted on another surface perpendicular to the one surface of the circuit substrate; a capacitor mounted between the electronic element and the optical element; and an optical waveguide array on which an optical waveguide is disposed.

An inclined surface may be formed between the one surface and the another surface, and the capacitor may be mounted on the inclined surface.

The capacitor may be connected in parallel to the electronic element and the optical element.

The electronic element and the capacitor may be connected via a first wire, and the capacitor and the optical element may be connected via a second wire.

In a case in which the optical module is formed as a multi-channel optical module, the numbers of electronic elements each identical to the electronic element, optical elements each identical to the optical element, and capacitors each identical to the capacitor corresponding to the number of channels may be mounted on the circuit substrate, and the number of optical waveguides each identical to the optical waveguide corresponding to the number of channels may be provided on the optical waveguide array.

In a case in which the optical waveguide array is coupled to the circuit substrate, the optical waveguide and the optical element may be closely disposed to face each other.

The circuit substrate may be formed of a metal material, and the circuit substrate formed of the metal material may be used as a common ground of the electronic element, the optical element, and the capacitor.

Metal pads may be formed on surfaces of the circuit substrate on which the electronic element, the optical element, and the capacitor are mounted, and grounds of the electronic element, the optical element, and the capacitor may be connected to the corresponding metal pads.

A capacitance value of the capacitor may be set according to an inductance component based on a length of the wire to perform impedance matching.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Figure 1:
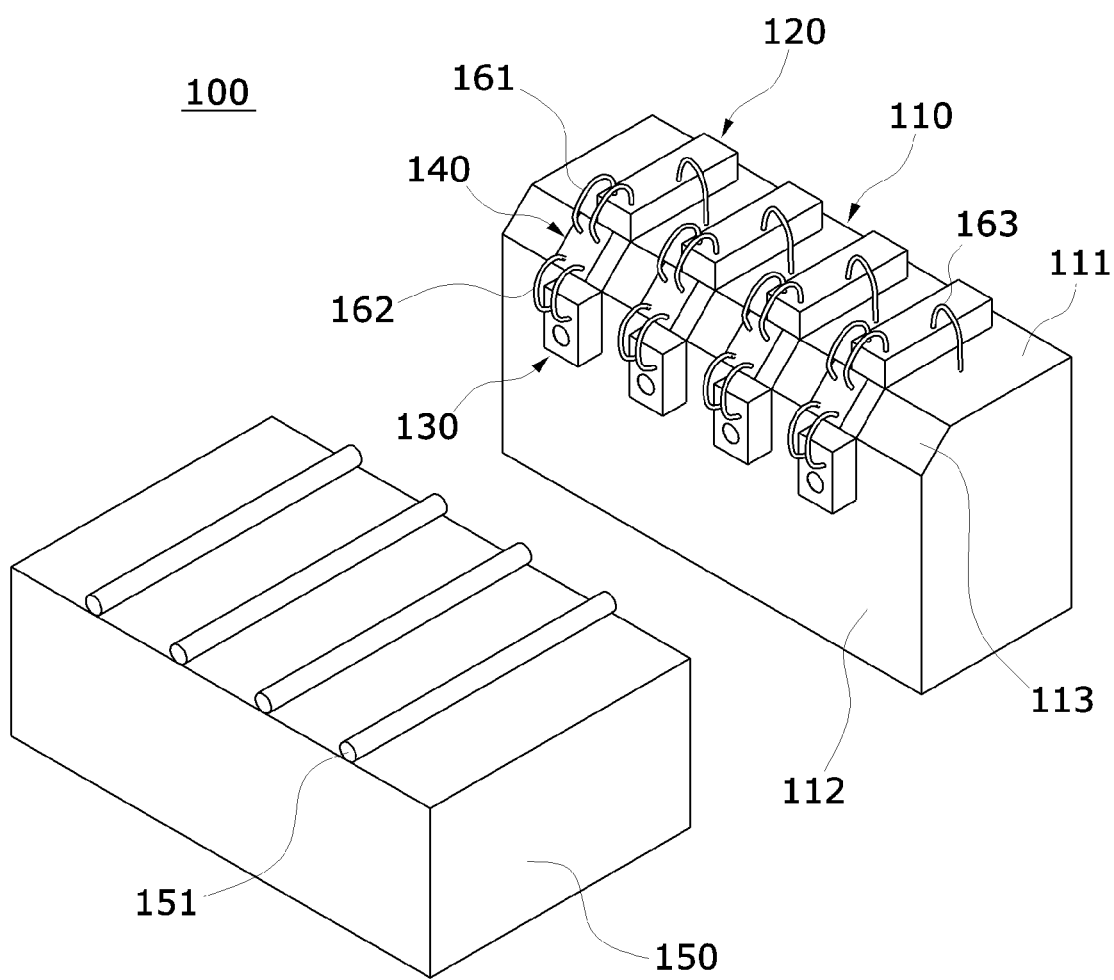
FIG. 1 is a perspective view illustrating one example of a multi-channel optical module according to an exemplary embodiment of the present invention.

In the embodiments of the present invention disclosed in the specification, specific structural and functional descriptions are directed only to providing examples for describing the embodiments of the present invention, and the embodiments of the present invention may be implemented in various forms. The present invention is not to be interpreted as being limited to the embodiments described in the specification.

While the present invention may be modified in various ways and have various alternative forms, specific embodiments thereof are shown in the drawings and described below in detail as examples. There is no intent to limit the present invention to the particular forms disclosed. On the contrary, the present invention is to cover all modifications, equivalents, and alternatives falling within the spirit and scope of the present invention.

It should be understood that, although the terms first, second, and the like may be used herein in reference to elements of the present invention, such elements are not to be construed as limited by the terms. The terms are only used to distinguish one element from another. For example, a first element could be termed a second element, and a second element could be termed a first element without departing from the scope of the present invention.

It should be understood that, when an element is referred to as being "connected" or "coupled" to another element, the element may be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," and the like).

The terminology used herein to describe the embodiments of the present invention is not intended to limit the scope of the present invention. The articles "a," "an," and "the" are singular in that they have a single referent, however the use of the singular form in the present document does not preclude the presence of more than one referent. In other words, elements of the present invention referred to in the singular may number one or more unless the context clearly indicates otherwise. It should be further understood that the terms "comprise," "comprising," "include," and/or "including," when used herein, specify the presence of stated features, numbers, steps, operations, elements, and/or components, but do not preclude the presence or addition of one or more other features, numbers, steps, operations, elements, components, and/or groups thereof.

Unless otherwise defined, all terms (including technical and scientific terms) used herein are to be interpreted as is customary in the art to which the present invention belongs. It should be further understood that terms in common usage should also be interpreted as is customary in the relevant art and not in an idealized or overly formal sense unless expressly so defined herein.

Meanwhile, when a certain embodiment may be implemented differently, a function or operation described in a specific block may be performed in a different order from an order described in a flowchart. For example, two consecutive blocks may be performed substantially at the same time or performed in an order opposite the described order according to a related function or operation.

Hereinafter, an optical module disclosed in the present invention will be described in detail with reference to the accompanying drawings.

Figure 2:
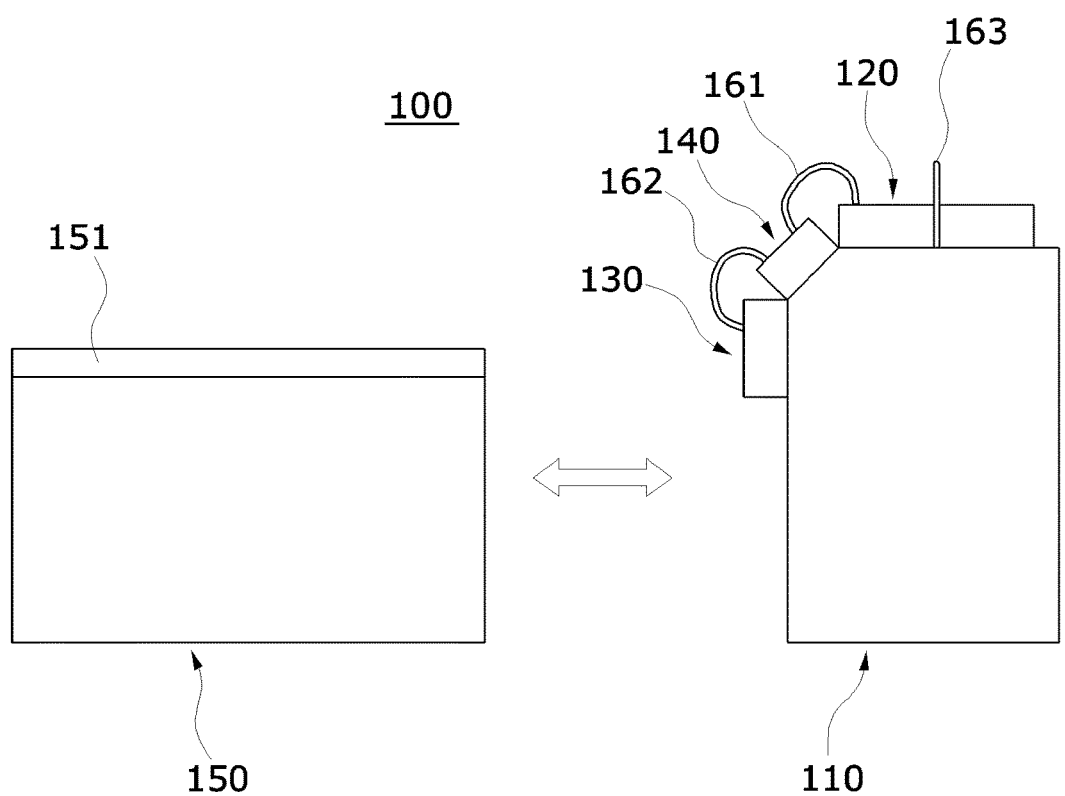
FIG. 2 is a side view illustrating the optical module of FIG. 1.

FIG. 1 is a perspective view illustrating one example of a multi-channel optical module according to an exemplary embodiment of the present invention, and FIG. 2 is a side view illustrating the optical module of FIG. 1.

Referring to FIGS. 1 and 2, a multi-channel optical module 100 according to the exemplary embodiment of the present invention may include a circuit substrate 110, electronic elements 120, optical elements 130, capacitors 140, and an optical waveguide array 150.

Here, the optical waveguide array 150 is coupled to the circuit substrate 110, and particularly, the optical waveguide array 150 is coupled to one surface (for example, one side surface) of the circuit substrate 110, on which the optical elements 130 are mounted, to face the optical elements 130.

In addition, the circuit substrate 110 may be provided with a guide such that the optical waveguide array 150 dose not depart from a predetermined location.

Meanwhile, the electronic elements 120, the optical elements 130, and the capacitors 140 are mounted on the circuit substrate 110, and optical waveguides 151 are disposed on the optical waveguide array 150.

In addition, the electronic elements 120 and the optical elements 130 are connected by first wires 161, the optical elements 130 and the capacitors 140 are connected by second wires 162, and the electronic elements 120 are connected to the circuit substrate 110 by third wires 163.

In a case in which the optical module 100 is formed as a multi-channel optical module, as shown in the embodiment, the numbers of the plurality of electronic elements 120, the plurality of optical elements 130, and the plurality of capacitors 140 mounted on the circuit substrate 110 corresponds to the number of channels to be formed. Similarly, the plurality of optical waveguides 151 are disposed on the optical waveguide array 150.

In the embodiment, it is assumed that the optical module 100 is formed to have four channels, and according to such an assumption, four electronic elements 120, four optical elements 130, and four capacitors 140 are mounted on the circuit substrate 110, and four optical waveguides 151 are disposed on the optical waveguide array 150.

In addition, for example, the electronic elements 120 may include driving circuits, preamplifiers, and the like, and the optical elements 130 may include light sources, photodetectors, and the like.

Meanwhile, the circuit substrate 110 may be formed in various shapes, and it is preferable for the electronic elements 120, the optical elements 130, and the capacitors 140 to be easily mounted on the circuit substrate 110.

As one example, the circuit substrate 110 may be formed in a rectangular column shape, the electronic elements 120 may be mounted on one surface 111 (for example, an upper surface) of the circuit substrate 110, the optical elements 130 may be mounted on another surface 112 (for example, one side surface) perpendicular to the one surface 111, and the capacitors 140 may be mounted between the electronic elements 120 and the optical elements 130, as shown in the embodiment.

Here, a corner between the upper surface 111 of the circuit substrate 110 on which the electronic elements 120 are mounted and the one side surface 112 of the circuit substrate 110 on which the optical elements 130 are mounted may be formed as an inclined surface 113 through a chamfering method and the like, and the capacitors 140 may be mounted on the inclined surface 113.

According to the embodiment, the optical elements 130 are mounted on the one side surface 112 of the circuit substrate 110, and the optical waveguide array 150 is coupled to the one side surface 112 of the circuit substrate 110.

As described above, in the case in which the optical waveguide array 150 is coupled to the one side surface 112 of the circuit substrate 110, the optical waveguides 151 and the optical elements 130 are closely disposed to face each other.

Since the optical waveguides 151 and the optical elements 130 are closely disposed to face each other, optical coupling efficiency between the optical waveguides 151 and the optical elements 130 may be maximized.

In addition, according to the embodiment, the capacitors 140 located between the electronic elements 120 and the optical elements 130 are connected to the electronic elements 120 and the optical elements 130 by the wires 161 and 162 such that the capacitors 140 serve as stepping-stones for wire bonding between the electronic elements 120 and the optical elements 130.

An effect obtained in the case in which the electronic elements 120 and the optical elements 120 are connected via the capacitors 140 will be specifically described below.

Figure 3:
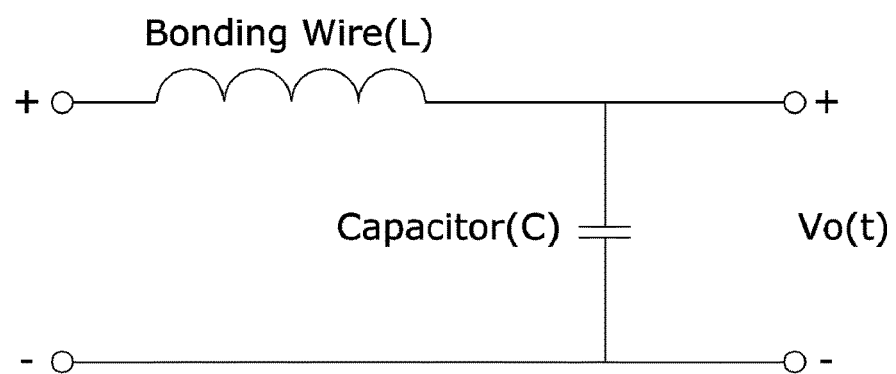
FIG. 3 is a view illustrating an equivalent circuit of a wire connecting an electronic element and an optical element.

FIG. 3 is a view illustrating an equivalent circuit of a wire in the case in which the electronic element 120 and the optical element 130 are directly connected by the wire.

As illustrated in FIG. 3, in a case in which a high speed signal is transmitted through the wire, the wire may be represented with an inductance L and a capacitance C connected in series, and since the capacitance C of the wire is very small, the inductance L is a main component of the wire.

When the electronic element and the optical element are electrically connected, impedance matching for transmitting a high frequency signal is very important.

A relation between an impedance $Z_0$, the capacitance C, and the inductance L may be described by the following Equation 1.

$$Z_0 \approx \sqrt{\frac{jwL}{jwC}} = \sqrt{\frac{L}{C}} \quad \text{[Equation 1]}$$

Since the capacitance C of the wire is very small and difficult to adjust, the impedance $Z_0$ of the wire is greatly affected by the inductance L, and in consideration of a characteristic in which the inductance L is proportional to a length of the wire, impedance matching is performed by adjusting the wire length.

However, since a wire conventionally used for an optical module and having a diameter of 25 μm has a high inductance, a length of the wire is limited within several hundreds of micrometers to implement 50 ohm impedance matching for securing a bandwidth of about several GHz.

Since the wire length is limited within a predetermined length for impedance matching, in a case in which the electronic element and the optical element are perpendicularly disposed, lengths of wires should be longer than those in a case in which the two elements are disposed on the same plane.

Accordingly, in the case in which the electronic element and the optical element are perpendicularly disposed, since the length should increase, the inductance increases, and thus there is a problem in that an impedance mismatch occurs.

As one example for solving the impedance mismatch problem occurring because of an inductance increase due to an increase in wire length, the present invention proposes a structure in which the capacitors 140 are disposed in parallel between the electronic elements 120 and the optical elements 130.

That is, according to Equation 1, since an impedance mismatch occurs because an inductance of a wire increases due to an increase in wire length, when capacitance is increased in proportion to the increase in inductance, the problem of the impedance mismatch may be solved.

As described above, as an increased inductance of the wire is compensated by increasing a capacitance thereof, the impedance of the wire may be set to a target value.

Accordingly, the impedance matching may be performed by adjusting capacitance values of the capacitors 140 located in parallel between the electronic elements 120 and the optical elements 130.

Meanwhile, the circuit substrate 110 formed of a metal material may be used for commonly grounding a surface on which the elements 120, 130, and 140 are mounted. That is, the circuit substrate 110 formed of the metal material is used as a common ground for the elements 120, 130, and 140.

Alternatively, a method in which metal pads are formed on the three surfaces 111, 112, and 113 on which the elements 120, 130, and 140 are mounted via metal (ex, Au) sputtering or gold (Au) plating and grounds of the electronic elements 120, optical elements 130, and the capacitors 140 are connected to the metal pads via wire bonding may also be used.

According to the above-described embodiment of the present invention, since the optical waveguides 151 and the optical elements 130 are closely disposed to face each other, optical signals may be input and output in a state in which an optical coupling loss due to changes in optical paths between the optical waveguides 151 and active areas (for example, light sources or photodetectors) of the optical elements 130 is minimized.

In addition, in the structure in which the electronic element 120 and the optical element 130 are perpendicularly disposed, since each of the capacitors 140 is applied between the electronic element 120 and the optical element 130, an impedance due to an increase in wire length is compensated, and thus an impedance matching structure adequate for transmitting a high frequency signal may be implemented.

An operation of the optical module will be divided into optical transmission and optical reception and described below with reference to FIGS. 1 and 2.

In the optical reception, the optical module 100 is operated such that an optical signal output from the optical waveguide 151 is incident on a photodetector in the optical element 130 and converted into a current signal, and the converted current signal is input to the electronic element 120 (for example, a preamplifier) via the capacitor 140.

In the optical transmission, the optical module 100 is operated such that an electrical signal is converted into a current signal by the electronic element 120 (for example, a laser diode driving circuit), the converted current signal is input to a light source in the optical element 130 (for example, a laser diode) via the capacitor 140, the light source outputs an optical signal corresponding to the current signal, and the output optical signal is incident on the optical waveguide 151.

As described above, since an optical waveguide and an optical element are closely disposed to face each other, an optical signal can be input and output in a state in which an optical coupling loss due to a change in optical path is minimized.

Since a capacitor is applied between an electronic element and an optical element, an impedance of a wire due to an increase in wire length is compensated, and thus an impedance matching structure adequate for transmitting a high frequency signal can be implemented. Therefore, a loss can be minimized and a frequency bandwidth can be maximized when the high frequency signal is transmitted.

In addition, embodiments of the present invention have advantages in that a manufacturing process thereof is simplified and a cost for components is decreased in comparison to a related technology.

While the optical module according to the present invention has been described above with reference to the embodiments, the scope of the present invention is not limited to the specific embodiments, and the present invention may be implemented within a range clear to those skilled in the art by being modified and substituted with an alternative.

Therefore, the embodiments and the accompanying drawings of the present invention should be considered in a descriptive sense only and not for purposes of limitation. The scope of the present invention is not limited by the embodiments and the accompanying drawings. It should be understood that the scope of the present invention is interpreted by the appended claims and encompasses all equivalent technological scopes.

What is claimed is:

1. An optical module comprising:
   a circuit substrate;
   an electronic element mounted on one surface of the circuit substrate;
   an optical element mounted on another surface perpendicular to the one surface of the circuit substrate;
   a capacitor mounted on an inclined surface of the circuit substrate, the capacitor is mounted between the electronic element and the optical element; and
   an optical waveguide array on which an optical waveguide is disposed,
   wherein the optical waveguide is disposed to face the optical element.

2. The optical module of claim 1, wherein:
   an inclined surface is formed between the one surface and the another surface; and
   the capacitor is mounted on the inclined surface.

3. The optical module of claim 1, wherein the capacitor is connected in parallel to the electronic element and the optical element.

4. The optical module of claim 3, wherein:
   the electronic element and the capacitor are connected via a first wire; and
   the capacitor and the optical element are connected via a second wire.

5. The optical module of claim 1, wherein, the optical module is formed as a multi-channel optical module;
   a number of electronic elements, a number of optical elements, and a number of capacitors corresponding to the number of channels are mounted on the circuit substrate; and
   a number of optical waveguides corresponding to the number of the channels are provided on the optical waveguide array.

6. The optical module of claim 1, wherein, the optical waveguide array is coupled to the circuit substrate, the optical waveguide and the optical element are closely disposed to face each other.

7. The optical module of claim 1, wherein:
   the circuit substrate is formed of a metal material; and
   the circuit substrate formed of the metal material is used as a common ground of the electronic element, the optical element, and the capacitor.

8. The optical module of claim 1, wherein:
   metal pads are formed on surfaces of the circuit substrate on which the electronic element, the optical element, and the capacitor are mounted; and
   grounds of the electronic element, the optical element, and the capacitor are connected to the corresponding metal pads.

9. The optical module of claim 1, wherein a capacitance value of the capacitor is set according to an inductance component based on a length of the wire to perform impedance matching.

10. The optical module of claim 1, wherein capacitance is increased in proportion to an increase in inductance.

11. The optical module of claim 5, wherein the electronic elements, the optical elements, the capacitors, and the optical waveguides are each identical to their respective electronic element, optical element, capacitor, and optical waveguide of a single channel optical module.

* * * * *